(12) United States Patent
Higashida

(10) Patent No.: US 9,640,612 B2
(45) Date of Patent: May 2, 2017

(54) SEMICONDUCTOR DEVICE

(71) Applicant: ROHM CO., LTD., Kyoto (JP)

(72) Inventor: Shoji Higashida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/987,729

(22) Filed: Jan. 4, 2016

(65) Prior Publication Data

US 2016/0141356 A1 May 19, 2016

(30) Foreign Application Priority Data

Dec. 17, 2008 (JP) ................. 2008-321295

(51) Int. Cl.
*H01L 29/06* (2006.01)
*H01L 29/10* (2006.01)
(Continued)

(52) U.S. Cl.
CPC ...... *H01L 29/0634* (2013.01); *H01L 29/0649* (2013.01); *H01L 29/1095* (2013.01); *H01L 29/66712* (2013.01); *H01L 29/7802* (2013.01)

(58) Field of Classification Search
CPC ............. H01L 29/0634; H01L 29/0649; H01L 29/1095; H01L 29/66712; H01L 29/7802
(Continued)

(56) References Cited

U.S. PATENT DOCUMENTS 6,475,864 B1 * 11/2002 Sato .................... H01L 29/0634
257/E21.418
6,673,679 B1 1/2004 Miyasaka et al.
(Continued)

FOREIGN PATENT DOCUMENTS

JP 2002-083962 A 3/2002
JP 2003-101022 A 4/2003
(Continued)

OTHER PUBLICATIONS

Chinese Office Action (English-language translation attached) issued on Nov. 26, 2012, in connection with the counterpart Chinese application.
(Continued)

*Primary Examiner* — Jerome Jackson, Jr.
*Assistant Examiner* — Bo Fan
(74) *Attorney, Agent, or Firm* — Rabin & Berdo, P.C.

(57) ABSTRACT

A semiconductor device includes: a first conductivity type semiconductor substrate; and a plurality of second conductivity type semiconductor regions, the respective second conductivity type semiconductor regions being embedded in a plurality of stripe shaped trenches formed in the semiconductor substrate so that the respective second conductivity type semiconductor regions are extended in the row direction or the column direction in parallel with a first principal surface of the semiconductor substrate and are spaced in a fixed gap mutually. The semiconductor substrate and the plurality of the semiconductor regions are depleted by a depletion layer extended in the direction in parallel to the first principal surface from a plurality of pn junction interfaces, and the respective pn junction interfaces are formed between the semiconductor substrate and the plurality of the semiconductor regions.

15 Claims, 5 Drawing Sheets

(51) Int. Cl.
*H01L 29/66* (2006.01)
*H01L 29/78* (2006.01)

(58) Field of Classification Search
USPC .................................. 257/213, 329; 438/268
See application file for complete search history.

(56) References Cited

U.S. PATENT DOCUMENTS

| | | | |
|---|---|---|---|
| 6,674,126 | B2 | 1/2004 | Iwamoto et al. |
| 6,693,338 | B2 | 2/2004 | Saitoh et al. |
| 2003/0025124 | A1 | 2/2003 | Deboy |
| 2003/0222327 | A1 | 12/2003 | Yamaguchi et al. |
| 2005/0280086 | A1 | 12/2005 | Saito et al. |
| 2006/0157813 | A1 | 7/2006 | Saito et al. |
| 2007/0177444 | A1 | 8/2007 | Miyajima |
| 2007/0210341 | A1* | 9/2007 | Park ................... H01L 29/0634 257/213 |
| 2008/0048175 | A1 | 2/2008 | de Fresart |

FOREIGN PATENT DOCUMENTS

| | | |
|---|---|---|
| JP | 2003-273355 A | 9/2003 |
| JP | 2006-202837 A | 8/2006 |
| JP | 2007-242914 A | 9/2007 |
| JP | 2008-159601 A | 7/2008 |
| WO | WO-2007/106658 A2 | 9/2007 |

OTHER PUBLICATIONS

Office Action (and its English-language translation), issued on Aug. 9, 2013, by the State Intellectual Property Office of the People's Republic of China, in connection with the counterpart Chinese patent application No. 200980151001.3, pp. 1-7.

Office Action (and its English-language translation), issued on Oct. 29, 2013, by the Japanese Patent Office in connection with the counterpart Japanese application No. 2008-321295.

* cited by examiner

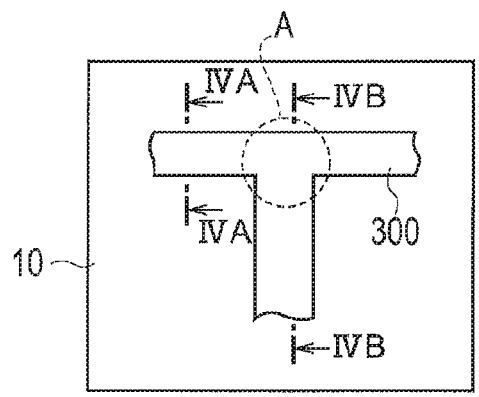
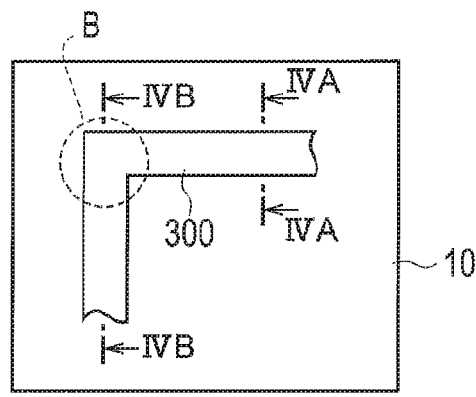
FIG. 3A  FIG. 3B
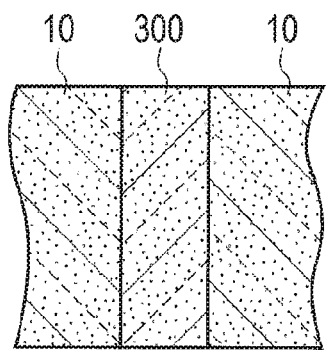
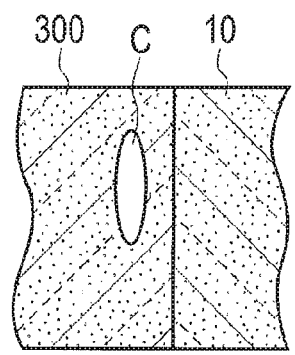
FIG. 4A  FIG. 4B

US 9,640,612 B2

SEMICONDUCTOR DEVICE

CROSS-REFERENCE TO RELATED APPLICATION

This is a continuation of U.S. application Ser. No. 13/140,316, filed on Jun. 16, 2011, and allowed on Aug. 26, 2015, which was a National Stage application of PCT/JP2009/070015, filed on Nov. 27, 2009, and claims the benefit of priority of Japanese Patent Application No. 2008-321295, filed on Dec. 17, 2008. The disclosures of these prior U.S. and foreign applications are incorporated herein by reference.

TECHNICAL FIELD

The present invention relates to a semiconductor device with which a low on resistance and a high breakdown voltage are required.

BACKGROUND ART

As a power semiconductor device with which a low on resistance and a high breakdown voltage are required, it has used a vertical semiconductor device by which electrodes are disposed on the both principal surfaces of a semiconductor substrate, respectively. For example, in a vertical power MOS field-effect transistor (MOSFET), current flows through a drift region inserted into between a source region and a drain region formed on the both principal surfaces of the semiconductor substrate, respectively. The drift region is a current path when the power MOSFET is turned ON, and the drift region is depleted and then the value of a breakdown voltage is improved when the power MOSFET is turned OFF.

In order to reduce the on resistance of the power MOSFET, it is effective to reduce an electric resistance of the drift region by improving a high impurity concentration of the drift region. However, if the high impurity concentration of the drift region is improved, the extension of a depletion layer becomes unsatisfactory, and then the value of the breakdown voltage is reduced. That is, there is a trade-off relationship between the high breakdown voltage and the low on resistance.

For this reason, it is proposed about a power MOSFET having a drift region of super-junction structure (for example, refer to Patent Literature 1). The drift region of the super-junction structure has a structure which disposes a pillar of p type semiconductor region and a pillar of n type semiconductor region alternately along the principal surface of the semiconductor substrate. The drift region is depleted by the depletion layer extended from a pn junction interface formed of the p type semiconductor regions and the n type semiconductor regions, and then the value of the breakdown voltage of power MOSFET is held. Therefore, even if the extension of the depletion layer becomes small by improving the high impurity concentration in order to achieve the low on resistance, the drift region can be completely depleted by narrowing the width between the pillar of the p type semiconductor region and the pillar of the n type semiconductor region. Accordingly, the low on resistance and high breakdown voltage of the power MOSFET are achievable.

CITATION LIST

Patent Literature 1: Japanese Patent Application Laying-Open Publication No. 2002-83962

SUMMARY OF INVENTION

Technical Problem

In order to achieve the drift region having the above-mentioned super-junction structure, it is used of a method of forming a deep trench on the semiconductor substrate and embedding the deep trench by a conductivity type epitaxial layer different from the semiconductor substrate. In this case, the "deep trench" is tens of μm in depth, for example, and is a trench having about 20 μm to 100 μm. However, when there is a region in which the distance from the side surface is different from other regions in the deep trench, a cavity area may be formed in the region where the distance from the side surface in the deep trench is long, without the deep trench being uniformly embedded by the epitaxial layer. There was a problem that the quality is degraded according to the reduction of the value of breakdown voltage and the increase of the leakage current, etc. of the semiconductor device resulting from the cavity area occurred in the drift region.

In view of the above-mentioned problem, the object of the present invention is to provide a semiconductor device which can control the occurring of the cavity area in the drift region.

Solution to Problem

According to one aspect of the present invention for achieving the above-mentioned object, it provides a semiconductor device comprising: (a) a first conductivity type semiconductor substrate; and (b) a plurality of second conductivity type semiconductor regions, the respective second conductivity type semiconductor regions being embedded in a plurality of stripe shaped trenches formed in the semiconductor substrate so that the respective second conductivity type semiconductor regions are extended in the row direction or the column direction in parallel with a first principal surface of the semiconductor substrate and are spaced in a fixed gap mutually, wherein the semiconductor substrate and the plurality of the semiconductor regions are depleted by a depletion layer extended in the direction in parallel to the first principal surface from a plurality of pn junction interfaces, and the respective pn junction interfaces are formed between the semiconductor substrate and the plurality of the semiconductor regions.

Advantageous Effects of Invention

According to the present invention, it can provide the semiconductor device with which the cavity area is not formed in the drift region.

BRIEF DESCRIPTION OF THE DRAWINGS

FIG. 3 FIG. 3A is a top view of a semiconductor region including a T shaped type, and FIG. 3B is a top view of a semiconductor region including an L shaped type.

FIG. 4 FIG. 4A is a cross-sectional diagram taken in the direction IVA-IVA of FIG. 3A and FIG. 3B, and FIG. 4B is a cross-sectional diagram taken in the direction IVB-IVB of FIG. 3A and FIG. 3B.

DESCRIPTION OF EMBODIMENTS

Figure 1:
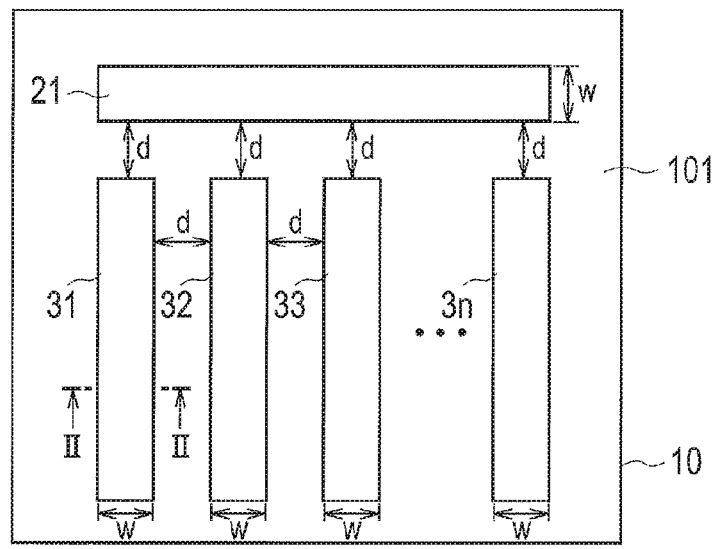
FIG. 1 A schematic top view showing a configuration of a semiconductor device according to an embodiment of the present invention.

Next, embodiments of the invention will be described with reference to drawing

In the description of the following drawings, the identical or similar reference numeral is attached to the identical or similar part. However, it should care about that the drawings are schematic and the relation between thickness and the plane size and the ratio of the thickness of each layer differs from an actual thing. Therefore, detailed thickness and size should be determined in consideration of the following description. Of course, the part from which the relation and ratio of a mutual size differ also in mutually drawings is included.

Also, the embodiments shown hereinafter exemplify the apparatus and method for materializing the technical idea of the present invention, and the technical idea of the present invention does not specify the material, shape, structure, placement, etc. of component parts as the following. Various changes can be added to the technical idea of the present invention in scope of claims.

As shown in FIG. 1, a semiconductor device according to an embodiment of the present invention includes: a first conductivity type semiconductor substrate 10; and a plurality of second conductivity type semiconductor regions (21, and 31 to 3n), the respective second conductivity type semiconductor regions (21, and 31 to 3n) being embedded in a plurality of stripe shaped trenches formed in the semiconductor substrate 10 so that the respective second conductivity type semiconductor regions (21, and 31 to 3n) are extended in the row direction or the column direction in parallel with a first principal surface 101 of the semiconductor substrate 10 and are spaced in a fixed gap mutually (where n is an integer greater than or equal to 2). Depletion layers extended in the direction in parallel to the first principal surface 101 from a plurality of pn junction interfaces formed, respectively, between the semiconductor substrate 10 and the semiconductor regions (21, and 31 to 3n) contacts mutually, and thereby both of the semiconductor substrate 10 and the semiconductor regions (21, and 31 to 3n) are depleted. In addition, although FIG. 1 shows the example that the second conductivity type semiconductor region extended to the row direction is only the semiconductor region 21, there may be a plurality of stripe shaped second conductivity type semiconductor regions extended to the row direction.

The first conductivity type and the second conductivity type are opposite conductivity types mutually. That is, the first conductivity type is a p type if the first conductivity type is a n type, and the second conductivity type is a n type if the second conductivity type is a p type. Hereinafter, the case where the semiconductor substrate 10 is an n-type semiconductor, and the semiconductor region (21, and 31 to 3n) is p-type semiconductors will be explained in exemplifying. However, the semiconductor substrate 10 may be a p-type semiconductor, and the semiconductor region (21 and 31 to 3n) may be n-type semiconductors.

As shown in FIG. 1, the mutual gap of the semiconductor regions 31 to 3n disposed in parallel with the row direction and extended in the column direction is fixed in the distance d. The gap between each edge part of the semiconductor regions 31 to 3n and the semiconductor region 21 extended to the row direction is also fixed in the distance d. The width w in the direction vertical to the direction to extend is also the same in between the semiconductor regions (21, and 31 to 3n). For example, the width w of the semiconductor region (21, and 31 to 3n) is 3 μm to 5 μm, and the distance d is not more than 10 μm (e.g., the distance d is 1 μm).

Figure 2:
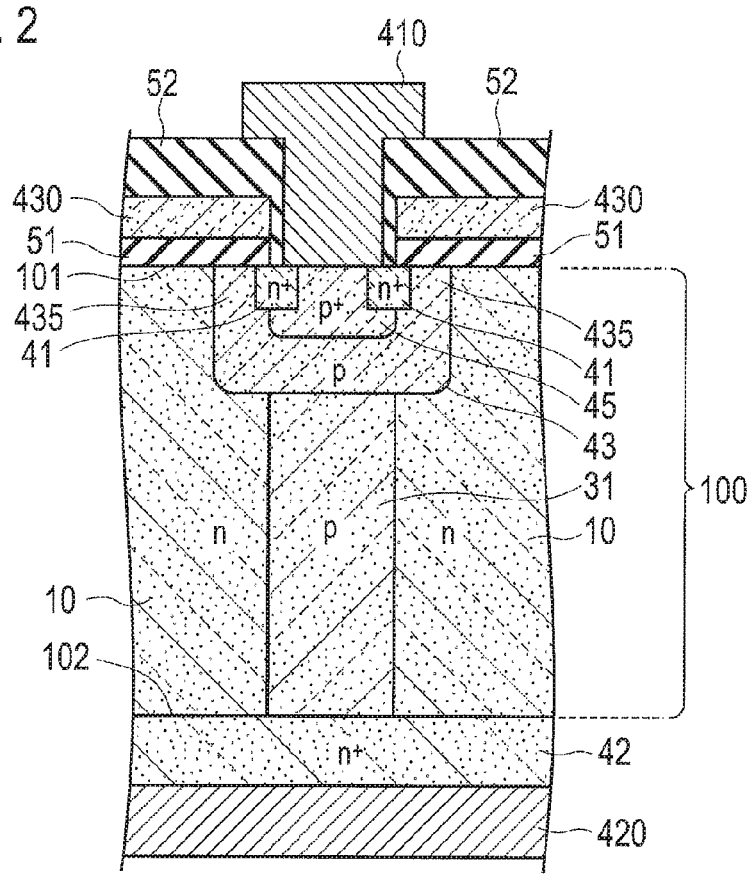
FIG. 2 A cross-sectional diagram taken in the direction of FIG. 1.

FIG. 2 shows a cross-sectional structure of the semiconductor region 31 and the semiconductor substrate 10 of periphery of the semiconductor region 31 taken in the direction (row direction) vertical to the direction which the semiconductor region 31 extends. As shown in FIG. 2, the shape of the semiconductor region 31 is pillar shape. Although FIG. 2 shows the cross-sectional structure of periphery of the semiconductor region 31, the cross-sectional structure of periphery of other semiconductor region (21, and 32 to 3n) is the same as that of the case of the semiconductor region 31. That is, the shape of the semiconductor region (21, and 31 to 3n) is pillar shape, and the shape of the region of the semiconductor substrate 10 sandwiched by the semiconductor regions (21, and 31 to 3n) is pillar shape. The semiconductor regions (21, and 31 to 3n) of the p-type semiconductor and the semiconductor substrate 10 of the n-type semiconductor between the semiconductor regions (21, and 31 to 3n) form super-junction structure, by alternately being disposed in the direction in parallel to the first principal surface 101.

Although it omitted illustrating in FIG. 1, a source region 41 and a base region 43 are formed near the first principal surface 101 of the semiconductor substrate 10, and a drain region 42 is formed on the second principal surface 102 of the semiconductor substrate 10, as shown in FIG. 2. That is, the semiconductor device shown in FIG. 2 is a vertical power MOSFET which applies the semiconductor regions (21, and 31 to 3n) and the semiconductor substrate 10 between the semiconductor regions (21, and 31 to 3n) as a drift region 100. When the power MOSFET shown in FIG. 2 is turned OFF, the semiconductor regions (21, and 31 to 3n) and the semiconductor substrate 10 between the semiconductor regions (21, and 31 to 3n) are completely depleted by the depletion layer extended from the pn junction interface formed of the semiconductor substrate 10 and the semiconductor regions (21, and 31 to 3n), and thereby the value of the breakdown voltage of the power MOSFET is held.

As shown in FIG. 2, the p type base region 43 whose peripheral part 435 faces the first principal surface 101 is disposed at the upper side of the semiconductor region 31, and the width of the base region 43 in the row direction in parallel to the first principal surface 101 is wider than that of the semiconductor region 31. Two $n^+$ type source regions 41 facing the first principal surface 101 are formed, respectively, between the peripheral part 435 and the central part of the base region 43. Also, a p+ type contact region 45 facing the first principal surface 101 is formed between the source regions 41.

In the circumference of the base region 43, a gate insulating film 51 is disposed on the first principal surface 101, and a gate electrode layer 430 is disposed on the gate insulating film 51. The peripheral part 435 of the base region 43 functions as a channel region. An interlayer insulating film 52 is disposed so as to cover the gate electrode layer 430, and a source electrode layer 410 is disposed on the interlayer insulating film 52. The source electrode layer 410 contacts the first principal surface 101 in an apertural area of the interlayer insulating film 52, and is connected with both of the source region 41 and the contact region 45. As shown in FIG. 2, the source electrode layer 410 is connected to both of the source region 41 and the contact region 45, in the first principal surface 101.

The semiconductor substrate 10 and the semiconductor regions (21, and 31 to 3n) contact the n+type drain region 42, in the second principal surface 102. A drain electrode layer 420 is disposed on the principal surface of the drain region 42 which opposes the principal surface which contacts the second principal surface 102.

Hereinafter, operation of the power MOSFET shown in FIG. 2 will be explained. In this case, it is assumed that the predetermined positive voltage is applied to the drain region 42 via the drain electrode layer 420, and the source region 41 and the base region 43 are grounded.

When turning ON the power MOSFET, the predetermined positive voltage is applied to the base region 43 via the gate electrode layer 430. As a result, a channel region of n type inversion layer is formed in the peripheral part 435 of the base region 43. A carrier (electron) is implanted into the n type semiconductor substrate 10 which composes the drift region 100 from the source region 41 via the inversion layer. Then, the carrier which passed through the drift region 100 arrives at the drain region 42. Accordingly, principal current (drain current) flows between the source region 41 and the drain region 42.

When turning OFF the power MOSFET, the potential of the gate electrode layer 430 is set up to become lower than the potential of the source region 41. Accordingly, the channel region formed in the peripheral part 435 disappears, and the injection of the carrier from the source region 41 to the drift region 100 is stopped. For this reason, the current does not flow between the source region 41 and the drain region 42. Since the semiconductor region (21, and 31 to 3n) is electrically connected with the source electrode layer 410 via the base region 43 and the source region 41, if reverse bias voltage is increased, the depletion layer is extended in the direction in parallel to the first principal surface 101 from the pn junction interface formed of the semiconductor substrate 10 and the semiconductor regions (21, and 31 to 3n). The drift region 100 is completely depleted by the depletion layer, and then the value of the breakdown voltage of the power MOSFET can be held.

In order to deplete the drift region 100 completely, the semiconductor regions (21, and 31 to 3n) are disposed so as to mutually space the fixed gap, and the width of the semiconductor regions (21, and 31 to 3n) and the width of the semiconductor substrates 10 disposed between the semiconductor regions (21, and 31 to 3n) are set up to the same, respectively. When the distance between the semiconductor regions (21, and 31 to 33) is not fixed in the chip, the variation in the breakdown voltage occurs in the region in the chip. The distance d is set up in consideration of the width of the depletion layer extended from the pn junction interface formed of the semiconductor substrate 10 and the semiconductor regions (21, and 31 to 3n).

A semiconductor regions (21, and 31 to 3n) are formed by embedding by a semiconductor layer which grew epitaxially the trenches formed in the substrate thickness direction from the first principal surface 101 of the semiconductor substrate 10. As shown in FIG. 1, the semiconductor regions (21, and 31 to 3n) are stripe shape, are disposed so to space mutually. That is, a semiconductor region 300 which is a T shaped type as the shape observed from the normal direction of the first principal surface 101 shows in FIG. 3A is not formed in the semiconductor substrate 10, and a semiconductor region 300 which is an L shaped type as the shape observed from the normal direction of the first principal surface 101 shows in FIG. 3B is also not formed in the semiconductor substrate 10.

Conventionally, the semiconductor region which composes super-junction structure may be disposed so that the shape of the apertural area formed on the first principal surface 101 in the peripheral region of the chip particularly may be a T shaped type or an L shaped type. In the trench which applied the apertural area as the T shaped type or the L shaped type, the distance from the side surface in the intersection and the angled region becomes larger than that of other regions.

For example, in an intersection region A shown by surrounding with a dashed line in FIG. 3A, and a curved region B shown by surrounding with a dashed line in FIG. 3B, the distance from the side surface of one side becomes large compared with that of other regions. When forming the semiconductor region 300 by embedding the trench with the semiconductor layer grown epitaxially, the semiconductor layer grows from the side surface of the trench. For this reason, in the intersection region A and the curved region B where both the distance from the side surface of one side is large, the cavity area is often formed in the semiconductor region 300. A cross-sectional diagram taken in the direction IVA-IVA of FIG. 3A and FIG. 3B is shown in FIG. 4A, and a cross-sectional diagram taken in the direction IVB-IVB of FIG. 3A and FIG. 3B is shown in FIG. 4B, respectively. Although the cavity area is not formed in the semiconductor region 300 in the region shown in FIG. 4A with which the trench is embedded by the semiconductor layer which grows from the side surfaces of the both sides of the trench, the cavity area C is easy to be formed in the semiconductor region 300 in the intersection region A and curved region B shown in FIG. 4B with which the semiconductor layer grows only from the side surface of one side of the trench.

Figure 5:
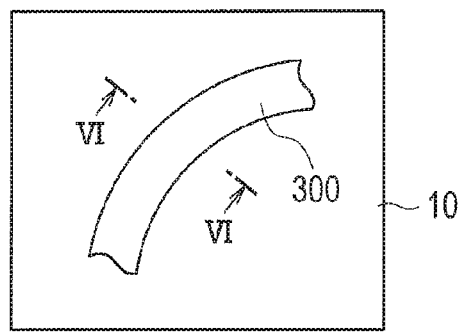
FIG. 5 A top view showing a curved semiconductor region.
Figure 6:
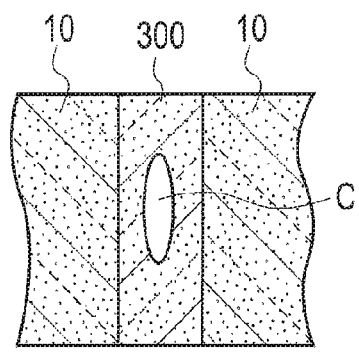
FIG. 6 A cross-sectional diagram taken in the direction VI-VI of FIG. 5.

Moreover, when the trench which forms the semiconductor region (21, and 31 to 3n) is formed so that the apertural area may be a curve as shown in FIG. 5, the crystal plane of the side surface of the trench will be not uniform. For this reason, when embedding the inside of the trench by using the semiconductor layer grown epitaxially, the epitaxial growth rate becomes variable depending on change of the crystal plane of the side surface of the trench, and then the cavity area C as shown in FIG. 6 is easy to be formed in the semiconductor region 300. FIG. 6 is a cross-sectional diagram taken in the direction VI-VI of FIG. 5.

On the other hand, in the semiconductor device shown in FIG. 1, the trench in which the semiconductor region (21, and 31 to 3n) is formed is a straight line, and there is no intersection region or no curved region since the semiconductor region (21, and 31 to 3n) is formed so as to space mutually. For this reason, the width w of the trench can always be fixed, and the crystal planes to appear in the side surface of the trench is always mutually the same. Therefore, the cavity area does not occur in the semiconductor region (21, and 31 to 3n) in which the inside of the trench is formed by being embedded with the semiconductor layer by epitaxial growth. That is, according to the semiconductor device according to the embodiment of the present invention, since the semiconductor device includes the stripe-shaped second conductivity type semiconductor region (21, and 31 to 3n) formed in the first conductivity type semiconductor substrate 10 so as to extend in the row direction or the column direction, respectively and space the fixed gap mutually, it can provide the semiconductor device which can control the occurring of the cavity area in the drift region 100.

Figure 7:
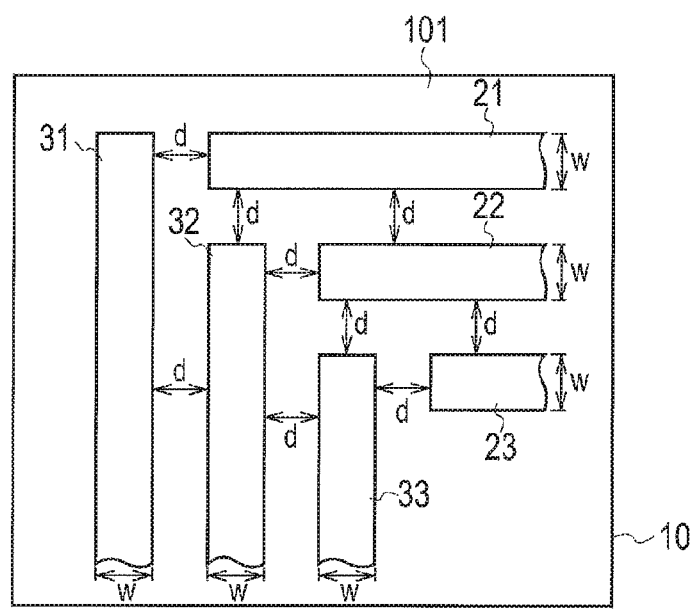
FIG. 7 A schematic top view showing another configuration of the semiconductor device according to the embodiment of the present invention.

FIG. 1 has showed the example of the stripe-shaped semiconductor regions (31 to 3n) disposed in parallel with the row direction. If the drift region 100 is formed of the plurality of the stripe-shaped semiconductor regions so as to space mutually, the example of the arrangement of the semiconductor region is not be limited to the arrangement shown in FIG. 1. For example, as shown in FIG. 7, the drift region 100 may be formed off the stripe-shaped semiconductor regions (31 to 33) extending in the column direction and disposed in parallel with the row direction, and the stripe-shaped semiconductor regions (21 to 23) extending to the row direction and disposed in parallel with the column direction. In the semiconductor device shown in FIG. 7, the width w of the semiconductor regions (21 to 23, and 31 to 33) is fixed, and the distance d between the semiconductor regions (21 to 23, and 31 to 33) is fixed, as well as the semiconductor device shown in FIG. 1.

A fabrication method of the semiconductor device according to the embodiment of the present invention will be explained referring the FIG. 8 to FIG. 11. FIG. 8 to FIG. 11 are cross-sectional diagrams taken in the direction II-II of FIG. 1, as well as FIG. 2. In addition, a fabrication method of the semiconductor device described hereinafter is an example, and, of course, it can achieve by various fabrication methods except this fabrication method, including its modified example.

Figure 8:
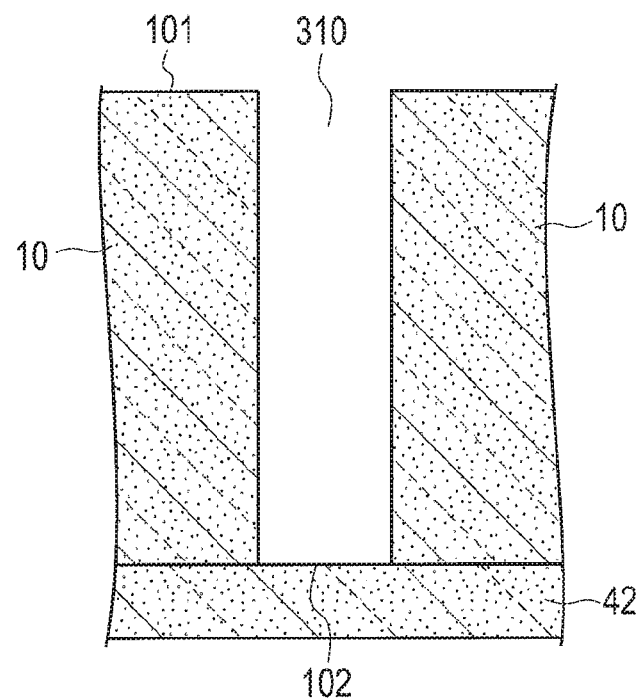
FIG. 8 A process cross-sectional diagram for explaining a fabrication method of the semiconductor device according to the embodiment of the present invention (Phase 1).

(a) For example, an n type semiconductor film whose n type high impurity concentration is about $1 \times 10^{12}$ to $1 \times 10^{13}$ cm$^{-3}$ is grown up on the whole surface of the drain region 42 which is n$^+$ type semiconductor layer whose n type high impurity concentration is not less than $1 \times 10^{19}$ cm$^{-3}$ by the epitaxial growth method, and thereby the semiconductor substrate 10 is formed. Then, as shown in FIG. 8, the semiconductor substrate 10 is selectively etched into a substrate thickness direction from the first principal surface 101 to the second principal surface 102 by using the photolithography technique etc., thereby forming a trench 310 in which the semiconductor region 31 is formed. The depth of the trench 310 is about 25 µm, for example. Although omitting the illustration, at this time, a plurality of stripe shaped trenches, in which the semiconductor regions (21, and 32 to 3n) are formed, respectively, are formed in the semiconductor substrate 10 so as to extend in the row direction or the column direction, respectively, and space mutually.

Figure 9:
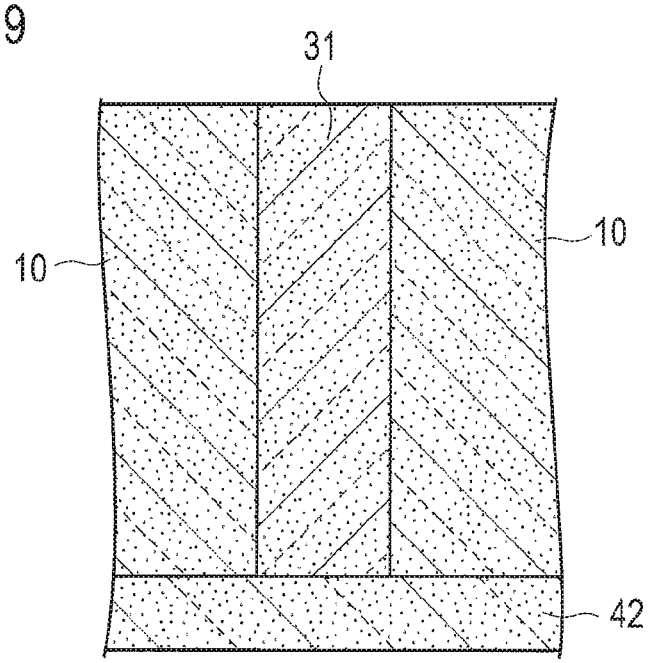
FIG. 9 A process cross-sectional diagram for explaining a fabrication method of the semiconductor device according to the embodiment of the present invention (Phase 2).

(b) Next, the trench 310 is embedded by a semiconductor layer (silicone film) whose p type high impurity concentration is about $1 \times 10^{13}$ to $1 \times 10^{14}$ cm$^{-3}$, thereby forming the semiconductor region 31. The semiconductor region 31 is formed by embedding the trench 310 with the semiconductor layer grown epitaxially from the side surface of the trench 310 by using the mixed gas between silane gas and chlorine series gas, for example. Although omitting the illustration, the semiconductor regions (21, and 32 to 3n) is formed as well as the semiconductor region 31, at this time. Then, the first principal surface 101 is planarized by the chemical mechanical polishing (CMP) method, and then the cross-sectional shape shown in FIG. 9 is obtained.

Figure 10:
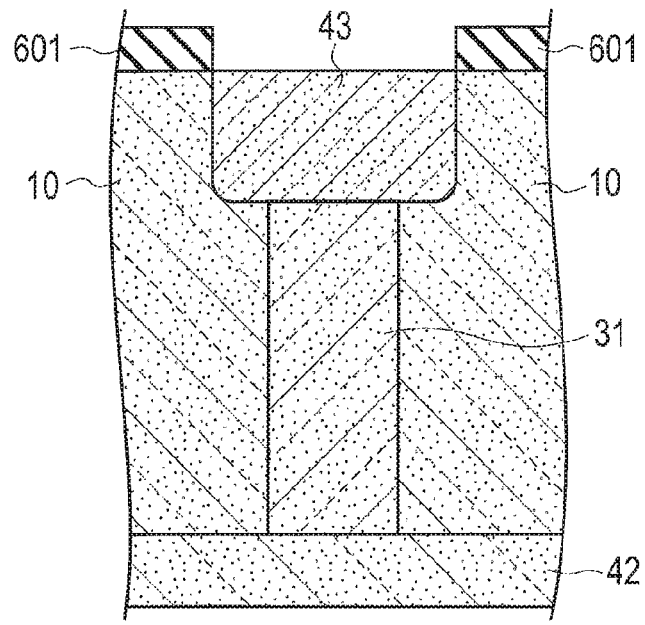
FIG. 10 A process cross-sectional diagram for explaining a fabrication method of the semiconductor device according to the embodiment of the present invention (Phase 3).

(c) Ion is selectively implanted into a part of upper part both of the semiconductor substrate 10 and the semiconductor regions (21, and 31 to 3n) by applying a photoresist film 601 formed by photolithography technique as a mask, thereby forming the p type base region 43 as shown in FIG. 10.

Figure 11:
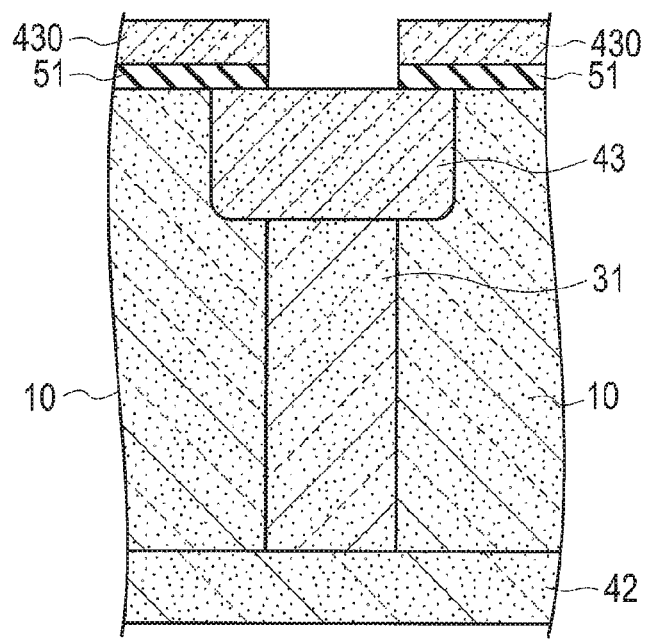
FIG. 11 A process cross-sectional diagram for explaining a fabrication method of the semiconductor device according to the embodiment of the present invention (Phase 4).

(d) After removing the photoresist film 601, a silicon dioxide film used as the gate insulating film 51 is formed on whole surface of the semiconductor substrate 10 and the base region 43, under the atmosphere of the high temperature of an oxidizing quality. An electrode layer used as the gate electrode layer 430 is formed on the silicon dioxide film. A polysilicon film formed by the chemical vapor deposition (CVD) method etc., for example is adoptable as the electrode layer. A part of base region 43 is exposed by patterning the electrode layer and the silicon dioxide film, thereby forming the gate electrode layer 430 and the gate insulating film 51 as shown in FIG. 11.

(e) Afterward, the source region 41, the contact region 45, the interlayer insulating film 52, the source electrode layer 410, and the drain electrode layer 420 are formed by using a well-known method etc., and thereby the semiconductor device shown in FIG. 2 is completed.

According to the fabrication method of the semiconductor device according to the above embodiment of the present invention, it can form the plurality of the stripe-shaped second conductivity type semiconductor regions (21, and 31 to 3n) formed in the first conductivity type semiconductor substrate 10 so as to extend in the row direction or the column direction, respectively and space the fixed gap mutually. Accordingly, it can provide the semiconductor device which can control the occurring of the cavity area in the drift region 100.

[Other Embodiments]

The present invention has been described by the embodiments, as a disclosure including associated description and drawings to be construed as illustrative, not restrictive. With the disclosure, artisan might easily think up alternative embodiments, embodiment examples, or application techniques.

Although the example of the power MOSFET is shown in the explanation of the already described embodiment, the present invention is applicable to other vertical semiconductor devices, for example, a power diode which disposes an anode electrode and a cathode electrode, respectively on both of the first principal surface 101 and the second principal surface 102 of the semiconductor substrate 10.

Such being the case, the present invention covers a variety of embodiments, whether described or not. Therefore, the technical scope of the present invention is appointed only by the invention specific matter related appropriate scope of claims from the above-mentioned explanation.

INDUSTRIAL APPLICABILITY

The semiconductor device according to the present invention is available to electronic industry including a manufacturing industry which fabricates power semiconductor devices.

REFERENCE SIGNS LIST

C: Cavity area;
10: Semiconductor substrate;

21 to 23: Semiconductor region;
31 to 3n: Semiconductor region;
41: Source region;
42: Drain region;
43: Base region;
45: Contact region;
51: Gate insulating film;
52: Interlayer insulating film;
100: Drift region;
101: First principal surface;
102: Second principal surface;
300: Semiconductor region;
310: Trench;
410: Source electrode layer;
420: Drain electrode layer;
430: Gate electrode layer; and
435: Peripheral part.

What is claimed is:

1. A semiconductor device comprising:
a first conductivity type semiconductor substrate having trenches formed therein and a first principal surface;
a plurality of second conductivity type base regions formed on the first principal surface; and
a plurality of second conductivity type semiconductor regions, each of respective top edges of the second conductivity type semiconductor regions contacting one of the second conductivity type base regions, the second conductivity type semiconductor regions extending in extension directions that are parallel to the first principal surface, the second conductivity type semiconductor regions further extending in a direction vertical to the first principal surface, the second conductivity type semiconductor regions respectively being embedded in a plurality of the trenches formed in the first conductivity type semiconductor substrate so that the second conductivity type semiconductor regions are extended in a row direction in parallel with the first principal surface of the semiconductor substrate or a column direction in parallel with the first principal surface of the semiconductor substrate, the second conductivity type semiconductor regions being spaced apart from each other by gaps, each of the second conductivity type semiconductor regions being in a respective one of the plurality of trenches, wherein
the extension directions parallel to the first principal surface in which the second conductivity type semiconductor regions extend, include at least two directions including a first direction and a second direction different from the first direction,
each second conductivity type semiconductor region of a first group of the plurality of the second conductivity type semiconductor regions is formed so as to extend in the first direction, and each second conductivity type semiconductor region of a second group of remaining ones of the second conductivity type semiconductor regions is formed so as to extend in the second direction,
each respective trench of the trenches that the first group is within, has a first crystal plane and a second crystal plane, the first crystal plane being a crystal plane of a sidewall at a long side of the respective trench, the second crystal plane being a crystal plane of a sidewall at a shorter side of the respective trench, and
each respective trench of the trenches that the second group is within, has a third crystal plane and a fourth crystal plane, the third crystal plane being a crystal plane of a sidewall at a long side of the respective trench, the fourth crystal plane being a crystal plane of a sidewall at a shorter side of the respective trench,
each of the trenches that the first group is within, is arranged so as to be orthogonal to each of the trenches that the second group is within, each of the first crystal planes forms a same plane with a corresponding one of the fourth crystal planes and has a same crystal structure as the corresponding one of the fourth crystal planes, and each of the second crystal planes forms a same plane with a corresponding one of the third crystal planes and has a same crystal structure as the corresponding one of the third crystal planes, and
the plurality of the second conductivity type semiconductor regions and parts of the first conductivity type semiconductor substrate between the second conductivity type semiconductor regions are depleted by a depletion layer extending in a direction parallel to the first principal surface from a plurality of pn junction interfaces, and the respective pn junction interfaces are formed between the first conductivity type semiconductor substrate and the plurality of the second conductivity type semiconductor regions.

2. The semiconductor device according to claim 1 further comprising:
a first main electrode disposed on the first principal surface of the semiconductor substrate; and
a second main electrode disposed on a second principal surface of the semiconductor substrate, wherein
principal current flows between the first main electrode and the second main electrode via the semiconductor substrate.

3. The semiconductor device according to claim 2 further comprising a second conductivity type control electrode area disposed on the second conductivity type semiconductor regions between the first main electrode and the semiconductor substrate,
wherein a first conductivity type channel region is formed in the control electrode area, and the principal current flows between the first main electrode and the second main electrode.

4. The semiconductor device according to claim 1, wherein the plurality of the second conductivity type semiconductor regions are formed in an inside of the trenches by epitaxial growth.

5. The semiconductor device according to claim 1, wherein a cross-sectional shape of the second conductivity type semiconductor regions, taken in a direction vertical to a direction which the second conductivity type semiconductor regions extend, is pillar-shaped.

6. The semiconductor device according to claim 1, wherein each of widths of the plurality of the second conductivity type semiconductor regions is mutually the same.

7. The semiconductor device according to claim 1, wherein each of widths of the plurality of the second conductivity type semiconductor regions and a width of one of the parts of the semiconductor substrate disposed between the plurality of the second conductivity type semiconductor regions are the same.

8. The semiconductor device according to claim 1, wherein a depth of the plurality of trenches is not less than 20 µm.

9. The semiconductor device according to claim 1, wherein a width of the trenches is fixed taken in a thickness direction of the semiconductor substrate.

10. The semiconductor device according to claim 1, wherein a measurement of the gaps between the plurality of second conductivity type semiconductor regions in a direction parallel to the first principal surface is not more than 10 µm.

11. The semiconductor device according to claim 1, wherein the first group of second conductivity type semiconductor regions are formed in stripe shapes to be spaced apart from each other by the gaps.

12. The semiconductor device according to claim 11, wherein the second group of second conductivity type semiconductor regions is formed in stripe shapes.

13. The semiconductor device according to claim 12, wherein
  a first stripe shape of the stripe shapes of the first group is extended in the first direction,
  a second stripe shape of the stripe shapes of the second group is extended in the second direction, and
  a lateral edge of the first stripe shape the is aligned with a longitudinal edge of the second stripe shape.

14. The semiconductor device according to claim 1, wherein the first direction is orthogonal to the second direction.

15. A semiconductor device comprising:
  a first conductivity type semiconductor substrate having trenches formed therein and a first principal surface;
  a plurality of second conductivity type base regions formed on the first principal surface; and
  a plurality of second conductivity type semiconductor regions, each of respective top edges of the second conductivity type semiconductor regions contacting one of the second conductivity type base regions, the second conductivity type semiconductor regions extending in extension directions that are parallel to the first principal surface, the second conductivity type semiconductor regions further extending in a direction vertical to the first principal surface, the second conductivity type semiconductor regions respectively being embedded in a plurality of the trenches formed in the first conductivity type semiconductor substrate so that the second conductivity type semiconductor regions are extended in a row direction in parallel with the first principal surface of the semiconductor substrate or a column direction in parallel with the first principal surface of the semiconductor substrate, the second conductivity type semiconductor regions being spaced apart from each other by gaps, each of the second conductivity type semiconductor regions being in a respective one of the plurality of trenches, wherein
  the extension directions parallel to the first principal surface in which the second conductivity type semiconductor regions extend, include at least two directions including a first direction and a second direction different from the first direction,
  each second conductivity type semiconductor region of a first group of the plurality of the second conductivity type semiconductor regions is formed so as to extend in the first direction, and each second conductivity type semiconductor region of a second group of remaining ones of the second conductivity type semiconductor regions is formed so as to extend in the second direction,
  each respective trench of the trenches that the first group is within, has a first crystal plane and a second crystal plane, the first crystal plane being a crystal plane of a sidewall at a long side of the respective trench, the second crystal plane being a crystal plane of a sidewall at a shorter side of the respective trench, and
  each respective trench of the trenches that the second group is within, has a third crystal plane and a fourth crystal plane, the third crystal plane being a crystal plane of a sidewall at a long side of the respective trench, the fourth crystal plane being a crystal plane of a sidewall at a shorter side of the respective trench,
  each of the trenches that the first group is within, is arranged so as to be orthogonal to each of the trenches that the second group is within, each of the first crystal planes has a same crystal structure as a corresponding one of the fourth crystal planes, and each of the second crystal planes has a same crystal structure as a corresponding one of the third crystal planes, and
  the plurality of the second conductivity type semiconductor regions and parts of the first conductivity type semiconductor substrate between the second conductivity type semiconductor regions are depleted by a depletion layer extending in a direction parallel to the first principal surface from a plurality of pn junction interfaces, and the respective pn junction interfaces are formed between the first conductivity type semiconductor substrate and the plurality of the second conductivity type semiconductor regions, wherein
  the gaps, are formed between the second conductivity type semiconductor regions that are adjacent to each other, and formed so as to be extended in both the first and second directions so that a plurality of the gaps extend in the first direction and a plurality of the gaps extend in the second direction, one of the gaps, that is between ends of first and second ones of the second conductivity type semiconductor regions arranged so as to be orthogonal to each other, has a same value of a dimension thereof as that of a second of the gaps, that is between ends of a third and fourth of the second conductivity type semiconductor regions that are arranged so as to be parallel to each other, and
  one of the gaps is formed between one of the second conductivity type semiconductor regions of the first group and one of the second conductivity type semiconductor regions of the second group that are adjacent to each other, and another of the gaps is formed between two of the second conductivity type semiconductor regions that are adjacent to each other of the first group or two of the second conductivity type semiconductor regions that are adjacent to each other of the second group.

* * * * *